(12) United States Patent
Kiryu (10) Patent No.: US 7,627,798 B2
(45) Date of Patent: Dec. 1, 2009

(54) SYSTEMS AND METHODS FOR CIRCUIT TESTING USING LBIST

(75) Inventor: Naoki Kiryu, Austin, TX (US)

(73) Assignee: Kabushiki Kaisha Toshiba, Tokyo (JP)

( * ) Notice: Subject to any disclaimer, the term of this patent is extended or adjusted under 35 U.S.C. 154(b) by 116 days.

(21) Appl. No.: 10/961,329

(22) Filed: Oct. 8, 2004

(65) Prior Publication Data

US 2006/0080585 A1 Apr. 13, 2006

(51) Int. Cl.
*G01R 31/28* (2006.01)

(52) U.S. Cl. .................. 714/733; 714/30; 714/724; 714/726; 714/727; 714/728; 714/729; 714/734; 714/736; 714/738; 714/739

(58) Field of Classification Search ............... None
See application file for complete search history.

(56) References Cited

U.S. PATENT DOCUMENTS

| | | | | |
|---|---|---|---|---|
| 4,097,797 A * | 6/1978 | Finet | | 714/736 |
| 4,304,001 A * | 12/1981 | Cope | | 714/4 |
| 4,654,850 A * | 3/1987 | Rodrigues et al. | | 714/736 |
| 4,680,760 A * | 7/1987 | Giles et al. | | 714/718 |
| 5,103,450 A * | 4/1992 | Whetsel | | 714/724 |
| 5,233,610 A * | 8/1993 | Nakayama et al. | | 714/704 |
| 5,396,595 A * | 3/1995 | Standley | | 710/68 |
| 5,541,940 A * | 7/1996 | Akita | | 714/800 |
| 5,983,380 A * | 11/1999 | Motika et al. | | 714/733 |
| 6,145,105 A * | 11/2000 | Nadeau-Dostie et al. | | 714/726 |
| 6,324,485 B1 * | 11/2001 | Ellis | | 702/117 |
| 6,407,567 B1 * | 6/2002 | Etter | | 324/760 |
| 6,480,979 B1 * | 11/2002 | Tomari | | 714/724 |
| 6,505,313 B1 * | 1/2003 | Phan et al. | | 714/718 |
| 6,559,671 B2 * | 5/2003 | Miller et al. | | 324/765 |
| 6,609,222 B1 * | 8/2003 | Gupta et al. | | 714/733 |
| 6,742,149 B2 * | 5/2004 | Osawa | | 714/726 |
| 6,760,873 B1 * | 7/2004 | Hao et al. | | 714/724 |
| 6,966,021 B2 * | 11/2005 | Rajski et al. | | 714/726 |
| 6,971,054 B2 * | 11/2005 | Kurtulik et al. | | 714/732 |
| 7,055,077 B2 * | 5/2006 | Kiryu et al. | | 714/726 |
| 7,085,980 B2 * | 8/2006 | Martin-de-Nicolas et al. | | 714/736 |
| 7,099,783 B2 * | 8/2006 | Hasegawa et al. | | 702/57 |
| 2001/0054166 A1 * | 12/2001 | Fukuda | | 714/733 |
| 2002/0125907 A1 * | 9/2002 | Kurtulik et al. | | 324/765 |
| 2002/0138801 A1 * | 9/2002 | Wang et al. | | 714/729 |
| 2002/0138802 A1 * | 9/2002 | Firth et al. | | 714/733 |
| 2002/0184560 A1 * | 12/2002 | Wang et al. | | 714/25 |

(Continued)

*Primary Examiner*—John P Trimmings
(74) *Attorney, Agent, or Firm*—Law Offices of Mark L. Berrier (57) ABSTRACT

Systems and methods for performing logic built-in-self-tests (LBISTS) in digital circuits. In one embodiment, the operation of LBIST circuitry is suspended at the end of each test cycle so that the bit patterns generated by the functional logic of the device under test can be examined to determine if any errors occurred during the test cycle. Pseudorandom bit patterns are scanned into the scan chains interposed between portions of the functional logic circuit and then propagated through the functional logic. The resulting bit patterns are captured in scan chains following the functional logic and then scanned out of the scan chains. The bit patterns are processed and compared to corresponding data generated by a parallel LBIST system in a device that is known to operate properly. The LBIST test cycles are then halted if there are errors in the generated bit patterns or resumed if there are no errors.

13 Claims, 7 Drawing Sheets

U.S. PATENT DOCUMENTS

| | | | |
|---|---|---|---|
| 2003/0009714 A1* | 1/2003 | Evans | 714/726 |
| 2003/0149925 A1* | 8/2003 | Angelotti et al. | 714/726 |
| 2003/0188243 A1* | 10/2003 | Rajan | 714/731 |
| 2003/0212940 A1* | 11/2003 | Wong | 714/725 |
| 2003/0229886 A1* | 12/2003 | Hasegawa et al. | 717/115 |
| 2003/0237025 A1* | 12/2003 | Song | 714/30 |
| 2005/0028058 A1* | 2/2005 | Perner | 714/718 |
| 2005/0081130 A1* | 4/2005 | Rinderknecht et al. | 714/726 |
| 2005/0120284 A1* | 6/2005 | Ouellette et al. | 714/718 |
| 2005/0138509 A1* | 6/2005 | Kiryu et al. | 714/726 |
| 2005/0251716 A1* | 11/2005 | Degrenand | 714/736 |
| 2006/0080585 A1* | 4/2006 | Kiryu | 714/733 |

* cited by examiner

SYSTEMS AND METHODS FOR CIRCUIT TESTING USING LBIST

BACKGROUND

1. Field of the Invention

The invention relates generally to the testing of electronic circuits, and more particularly to systems and methods for controlling the execution of LBIST test cycles to allow the examination of bit patterns produced by the functional logic of a device under test.

2. Related Art

Digital devices are becoming increasingly complex. As the complexity of these devices increases, there are more and more chances for defects that may impair or impede proper operation of the devices. The testing of these devices is therefore becoming increasingly important.

Testing of a device may be important at various stages, including in the design of the device, in the manufacturing of the device, and in the operation of the device. Testing at the design stage ensures that the design is conceptually sound. Testing during the manufacturing stage may be performed to ensure that the timing, proper operation and performance of the device are as expected. Finally, after the device is manufactured, it may be necessary to test the device at normal operating speeds to ensure that it continues to operate properly during normal usage.

One way to test for defects in a logic circuit is to use a deterministic approach. In a deterministic method, each possible input pattern is applied at the inputs of the logic circuit, with each possible set of state values in the circuit. The output pattern generated by each set of inputs and state values is then compared with the expected output pattern to determine whether the logic circuit operated properly. If the number of possible input patterns and state values is high, however, the cost of deterministic testing of all the combinations is generally too high for this methodology to be practical. An alternative method of testing that has a lower cost is therefore desirable.

One alternative is a non-deterministic approach in which pseudorandom input test patterns are applied to the inputs of the logic circuit. The outputs of the logic circuit are then compared to the outputs generated in response to the same pseudorandom input test patterns by a logic circuit that is known to operate properly. If the outputs are the same, there is a high probability that the logic circuit being tested also operates properly. The more input test patterns that are applied to the logic circuits, and the more random the input test patterns, the greater the probability that the logic circuit under test will operate properly in response to any given input pattern. This non-deterministic testing approach is typically easier and less expensive to implement than a deterministic approach.

One test mechanism that can be used to implement a deterministic testing approach is a built-in self test (BIST). This may also be referred to as a logic built-in self test (LBIST) when applied to logic circuits. BIST and LBIST methodologies are generally considered part of a group of methodologies referred to as design-for-test (DFT) methodologies. DFT methodologies impact the actual designs of the circuits that are to be tested. LBIST methodologies in particular involve incorporating circuit components into the design of the circuit to be tested, where the additional circuit components are used for purposes of testing the operation of the circuit's logic gates.

In a typical LBIST system, LBIST circuitry within a device under test includes a plurality of scan chains interposed between levels of the functional logic of the device. Typically, pseudorandom patterns of bits are generated and stored in the scan chains. This may be referred to as scanning the data into the scan chains. After a pseudorandom bit pattern is scanned into a scan chain, the data is propagated through the functional logic to a subsequent scan chain. The data is then scanned output of the subsequent scan chain. This test cycle is typically repeated many times (e.g., 10,000 iterations,) with the results of each test cycle being combined in some manner with the results of the previous test cycles. After all of the scheduled test cycles have been completed, the final result is compared to a final result generated by a device that is known to operate properly. Based upon this comparison, it is determined whether the device under test operated properly.

While this methodology is useful to determine whether the device under test operated properly (and can therefore be expected to continue to operate properly,) it is not useful to determine the source of an error that occurs during the test. Because many test cycles are executed prior to the comparison of generated results and the corresponding determination of whether an error occurred, the error may have occurred in any one of these cycles. Moreover, because the results of each test cycle are combined with the previous results, the final bit pattern generated by the multi-cycle test does not provide a useful tool for diagnosis of the error.

It would therefore be desirable to provide systems and methods for performing LBIST testing on a device, such that the results of the LBIST testing are useful in determining the source of any errors that occurred during the testing.

SUMMARY OF THE INVENTION

One or more of the problems outlined above may be solved by the various embodiments of the invention. Broadly speaking, the invention comprises systems and methods for performing logic built-in-self-tests (LBISTs) in digital circuits. In one embodiment, the operation of LBIST circuitry is suspended at the end of each test cycle so that the bit patterns generated by the functional logic of the device under test can be examined to determine if any errors occurred during the test cycle. In one embodiment, pseudorandom bit patterns are scanned into the scan chains interposed between portions of the functional logic circuit and then propagated through the functional logic. The resulting bit patterns are captured in scan chains following the functional logic and then scanned out of the scan chains. The bit patterns are processed and compared to corresponding data generated by a parallel LBIST system in a device that is known to operate properly. The LBIST test cycles are then halted if there are errors in the generated bit patterns or resumed if there are no errors.

The invention may be implemented in a variety of ways, and a number of exemplary embodiments will be described in detail below. In one embodiment, a method includes executing test cycles of an LBIST system in a device under test. Each test cycles has a functional phase, a scan shift phase and a hold phase. In the functional phase, functional operations such as propagating data through functional logic of the device under test are performed. In the scan shift phase, scan shift operations such as scanning data into and out of scan chains interposed between portions of the functional logic are performed. In the hold phase, functional operations and scan shift operations are suspended so that the data scanned out of the scan chains can be examined to determine if any errors occurred in the processing of the data by the functional logic. This examination may consist of comparing the data to corresponding data that is produced by the LBIST system in an identical device that is known to operate properly. If the data generated in the device under test has no errors, another test cycle is executed. If the data includes errors, the testing is halted, and the source of the errors can be diagnosed using the erroneous data.

Another embodiment comprises an LBIST controller that is coupled to LBIST circuitry implemented in a device under test, and configured to generate control signals to control the LBIST circuitry. The LBIST controller is configured to manage test cycles of the LBIST circuitry, including initiating a functional phase, a scan shift phase and a hold phase, as described above.

Yet another embodiment comprises a system including first and second devices having LBIST circuitry incorporated in them. One of the devices is under test, and the other device is a "good" device that is known to operate properly. The system includes one or more LBIST controllers coupled to the first and second devices and configured to control the LBIST circuitry of the two devices. The LBIST controllers periodically (e.g., at the end of each test cycle) suspend functional and scan shift operations of the LBIST circuitry in the two devices so that data generated by the functional logic of the devices can be compared. If the data of the two devices matches, no errors have occurred in the device under test, and succeeding test cycles may be performed. If the data does not match, an error has occurred, and the testing can be halted to allow diagnosis of the source of the error.

Numerous additional embodiments are also possible.

BRIEF DESCRIPTION OF THE DRAWINGS

Other objects and advantages of the invention may become apparent upon reading the following detailed description and upon reference to the accompanying drawings.

While the invention is subject to various modifications and alternative forms, specific embodiments thereof are shown by way of example in the drawings and the accompanying detailed description. It should be understood, however, that the drawings and detailed description are not intended to limit the invention to the particular embodiments which are described. This disclosure is instead intended to cover all modifications, equivalents and alternatives falling within the scope of the present invention as defined by the appended claims.

DETAILED DESCRIPTION OF PREFERRED EMBODIMENTS

One or more embodiments of the invention are described below. It should be noted that these and any other embodiments described below are exemplary and are intended to be illustrative of the invention rather than limiting.

As described herein, various embodiments of the invention comprise systems and methods for performing logic built-in-self-tests (LBISTs) in digital circuits, where the operation of the LBIST circuitry is suspended at the end of each test cycle so that the bit patterns generated by the functional logic of the device under test can be examined to determine if any errors occurred during the test cycle.

In one embodiment, a STUMPS-type LBIST test architecture is incorporated into the design of a logic circuit. The LBIST components include a set of scan chains interposed between portions of the functional logic of the logic circuit. Pseudorandom bit patterns are scanned into the scan chains so that the pseudorandom bit patterns can be propagated through the functional logic following the scan chains. The resulting bit patterns are captured in scan chains following the functional logic and then scanned out of these scan chains. After the generated bit patterns are scanned out of the scan chains, operation of the LBIST circuitry is suspended so that the generated bit patterns can be examined and/or compared to expected bit patterns to determine whether an error has occurred in the processing of the pseudorandom bit patterns. While operation of the LBIST circuitry is suspended, the state of the LBIST circuitry is maintained, so that it does not have to be re-initialized before resuming operation.

In one embodiment, LBIST testing is performed in parallel on a logic circuit under test and a logic circuit that is known to operate properly (a "good" logic circuit.) After each test cycle (i.e., after the pseudorandom bit patterns have been propagated through the functional logic and scanned out of the scan chains,) operation of the LBIST circuitry in both logic circuits is suspended. While operation of the LBIST circuitry is suspended, the bit patterns generated by the logic circuit under test are compared to the corresponding bit patterns generated by the good logic circuit. If any of the bits in the compared bit patterns are different, an error has occurred in the logic circuit under test, and the LBIST testing is halted. Because the bits in error have not been combined with other bit patterns (as in conventional STUMPS-type LBIST systems,) it can be determined from the bits in error which particular portion of the functional logic within the logic circuit under test has malfunctioned.

The various embodiments of the invention may provide a number of advantages over conventional systems. For example, a conventional STUMPS-type LBIST system is designed so that, when LBIST testing is initiated, test cycles are performed repetitively, until the predetermined number of cycles has been reached. After each test cycle, the bit patterns generated by the functional logic are scanned out of the scan chains and combined with other data (e.g., in a multiple input signature register.) The combined results are examined once, after the predetermined number of test cycles has been completed. There is no way in a conventional LBIST system to determine when an error has occurred, to temporarily suspend the testing to examine the bit patterns generated by the functional logic, or to resume testing after it has been halted.

Various embodiments of the invention will be described below. Primarily, these embodiments will focus on implementations of a STUMPS-type LBIST architecture which is implemented within an integrated circuit. It should be noted that these embodiments are intended to be illustrative rather than limiting, and alternative embodiments may be implemented in BIST architectures other than the STUMPS architecture, and may also be implemented in circuits whose components are not strictly limited to logic components (e.g., AND gates, OR gates, and the like). Many such variations will be apparent to persons of ordinary skill in the art of the invention and are intended to be encompassed by the appended claims.

Figure 1:
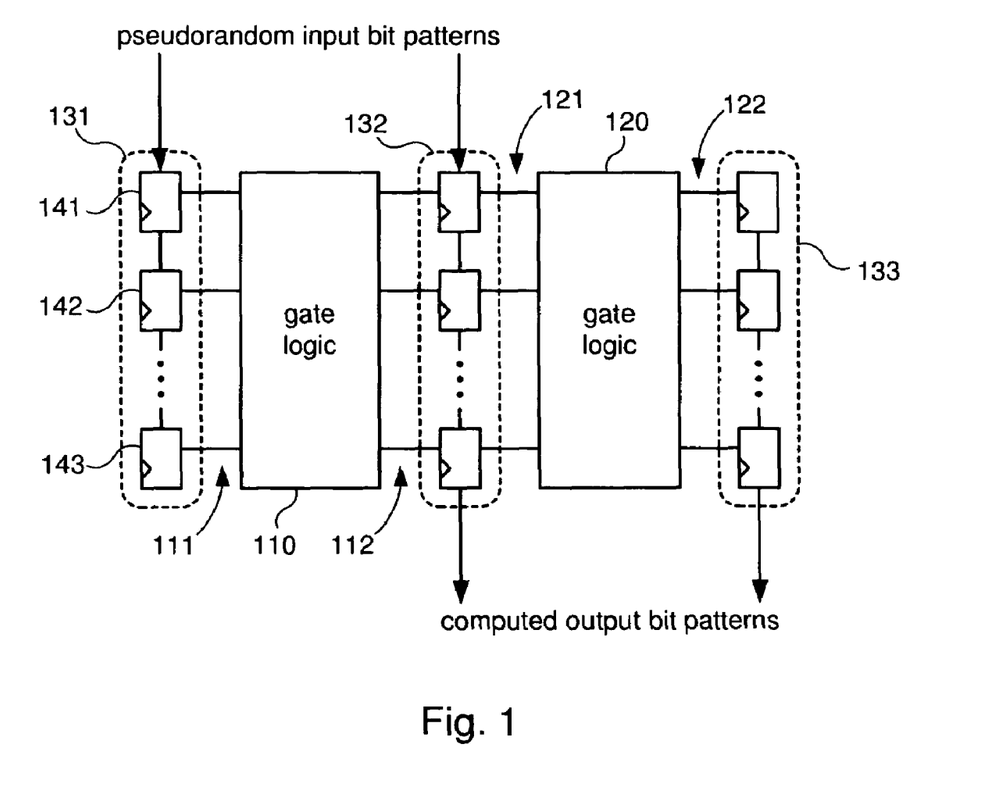
FIG. 1 is a functional block diagram illustrating the principal operation of a simple STUMPS LBIST system.

Referring to FIG. 1 a functional block diagram illustrating the principal operation of a simple STUMPS LBIST system is shown. The LBIST system is incorporated into an integrated circuit. In this figure, the functional logic of the integrated circuit includes a first portion 110 and a second portion 120. Functional logic 110 is, itself, a logic circuit having a plurality of inputs 111 and a plurality of outputs 112. Similarly, functional logic 120 forms a logic circuit having a plurality of inputs 121 and a plurality and outputs 122. Functional logic 110 is coupled to functional logic 120 so that, in normal operation, outputs 112 of functional logic 110 serve as inputs 121 to functional logic 120.

Each of the inputs to, and outputs from, functional logic 110 and 120 is coupled to a scan latch. The set of scan latches 131 that are coupled to inputs 111 of functional logic 110 forms one is referred to as a scan chain. The latches are serially coupled together so that bits of data can be shifted through the latches of a scan chain. For example, a bit may be scanned into latch 141, then shifted into latch 142, and so on, until it reaches latch 143. More specifically, as this bit is shifted from latch 141 into latch 142, a second bit is shifted into latch 141. As a bit is shifted out of each latch, another bit is shifted into the latch. In this manner, a series of data bits can be shifted, or scanned, into the set of latches in scan chain 131, so that each latch stores a corresponding bit. Data can likewise be scanned into the latches of scan chain 132.

Just as data can be scanned into the latches of a scan chain (e.g., 131,) data can be scanned out of the latches of a scan chain. As depicted in FIG. 1, the latches of scan chain 132 are coupled to the outputs of functional logic 110. Each of these latches can store a corresponding bit than his output by functional logic 110. After these output bits are stored in the latches of scan chain 132, the output data bits can be shifted through the series of latches and provided as an output bit stream. Data can likewise be scanned out of the latches of scan chain 133. It should be noted that the structure illustrated in FIG. 1 does not show data being scanned into scan chain 133, or data being scanned out of scan chain 131. Alternative embodiments may be configured to scan data in and out of these scan chains.

The LBIST system of FIG. 1 operates basically as follows. Pseudorandom bit patterns are generated and are scanned into the scan chains (131, 132) that are coupled to the inputs of functional logic 110 and 120. The pseudorandom bit patterns that are stored in scan chains 131 and 132 are then propagated through the corresponding functional logic. That is, the bit pattern in scan chain 131 is propagated through functional logic 110, while the bit pattern in scan chain 132 is propagated through functional logic 120. Functional logic 110 and 120 process the inputs and generate a corresponding set of outputs. These outputs are captured (stored) in the scan chains (132 and 133) that are coupled to the outputs of the functional logic. The output bit patterns stored in scan chains 132 and 133 are then scanned out of these scan chains.

Figure 2:
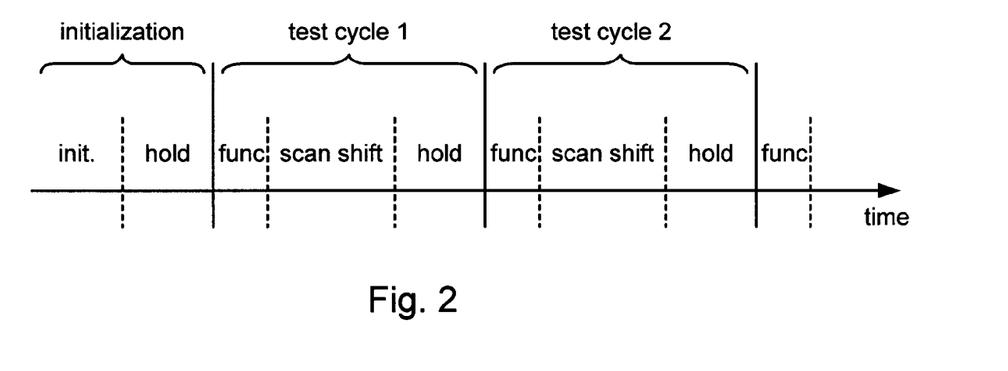
FIG. 2 is a diagram illustrating the phases of operation of the LBIST system in accordance with one embodiment.

Referring to FIG. 2, a diagram illustrating the phases of operation of the LBIST system in accordance with one embodiment is shown. FIG. 2 shows four different phases of operation of the LBIST system: initialization; hold; function; and scan shift. In the initialization phase, the various components of the system are prepared for normal operation. This may include resetting various components, providing a seed for a pseudorandom number generator, setting values in registers, and so on. In the hold phase, operation of various components of the LBIST system is temporarily suspended in order to enable comparison and/or analysis of data generated within the system. In the function phase, data is propagated through the functional logic of the device in which the LBIST system is implemented. In the scan shift phase, data is scanned into and out of the scan chains of the LBIST system.

As a shown in figure, operation of the LBIST system begins with the initialization phase. As noted above, the system is prepared for normal operation during this phase. As noted above, the various components of the system are prepared for operation during this phase. As will be discussed in more detail, several counters, including a mode counter and a shift register cycle counter, are reset. It may be necessary to ensure that several registers (e.g., function register, hold register, scan register) have the appropriate values stored therein, as will also be discussed below. Because the first test cycle in the embodiment depicted in FIG. 2 begins with a function phase, it is also necessary and the initialization phase to generate a first set of pseudorandom bit patterns and to load these bit patterns into the scan chains that are interposed between the functional logic of the device under test. After these operations are performed, the LBIST system is ready for operation, and the system enters a hold phase, during which the system waits for an indication that it should begin operation.

Following the initial hold phase, the LBIST system begins a first test cycle that includes a functional phase, a scan shift phase and a hold phase. During the functional phase, the data that was scanned into the scan chains is propagated through the functional logic of the device under test. At the end of this functional phase, the output of the functional logic is captured by the scan chains. As noted above, a scan chain that is positioned between successive functional logic blocks serves to both provide inputs to one of the functional logic blocks and capture the outputs of the other of the functional logic blocks. The data that is captured in the scan chains at the end of the functional phase is scanned out of the scan chains during the scan shift phase. At the same time the captured data is scanned out of the scan chains, new pseudorandom bit patterns are scanned into the scan chains to prepare for the functional phase of the next test cycle.

When the captured data has been scanned out of the scan chains, the system enters a hold phase. During the hold phase, the functional and scan shift operations of the LBIST system are temporarily suspended. While these operations are suspended, the state of the system is maintained, so that the functional and scan shift operations can be resumed after the hold phase without having to re-initialize the system. During the hold phase, the data that was captured in the scan chains can be processed and examined (before or after processing) to determine whether the functional logic blocks performed correctly. In one embodiment, the captured data from all of the scan chains in the system is compacted and provided to a multiple input signature register (MISR.) The signature data in this register is then compared to expected data. The expected data may, for example, comprise signature data in the MISR of an identical device (a "good" device) that is running in parallel with the device under test. If the signatures match, the device under test is operating properly, and the system proceeds to the next test cycle. If the signatures do not match, the device under test has malfunctioned, and operation of the system may either remain suspended or be halted to allow the malfunction to be diagnosed.

If the examination of the MISR (or other examination of the captured data) indicates that a malfunction has occurred in the device under test, diagnosis of the malfunction may proceed using the captured data, MISR data, or other data that may be available within the LBIST system. The specific means for analyzing the data will not be discussed here, as they are beyond the scope of the present disclosure. It should be noted, however, that, because the operation of the present LBIST system can be suspended or halted upon the occurrence of a malfunction, the system contains data that can be useful in the diagnosis of the malfunction. As played out above, this type of data is not available in conventional LBIST systems because the erroneous data resulting directly from the malfunction is conventionally combined with subsequent data, so that the original error is obscured.

If the examination of the MISR signature or other data indicates that the functional logic of the device under test operated properly during the first test cycle, the system proceeds to a second test cycle, beginning with a functional phase. At the end of the functional phase, the resulting captured data is scanned out of the scan chains (during the scan shift phase) and examined during a subsequent hold phase. During the hold phase of each test cycle, the data that was scanned out of the scan chains is examined to determine if an error occurred and, if necessary, the LBIST testing can remain suspended, or be halted, to enable diagnosis of malfunctions using the available data. The test cycles can be repeated a predetermined number of times and then automatically halted if no errors are detected.

Figure 3:
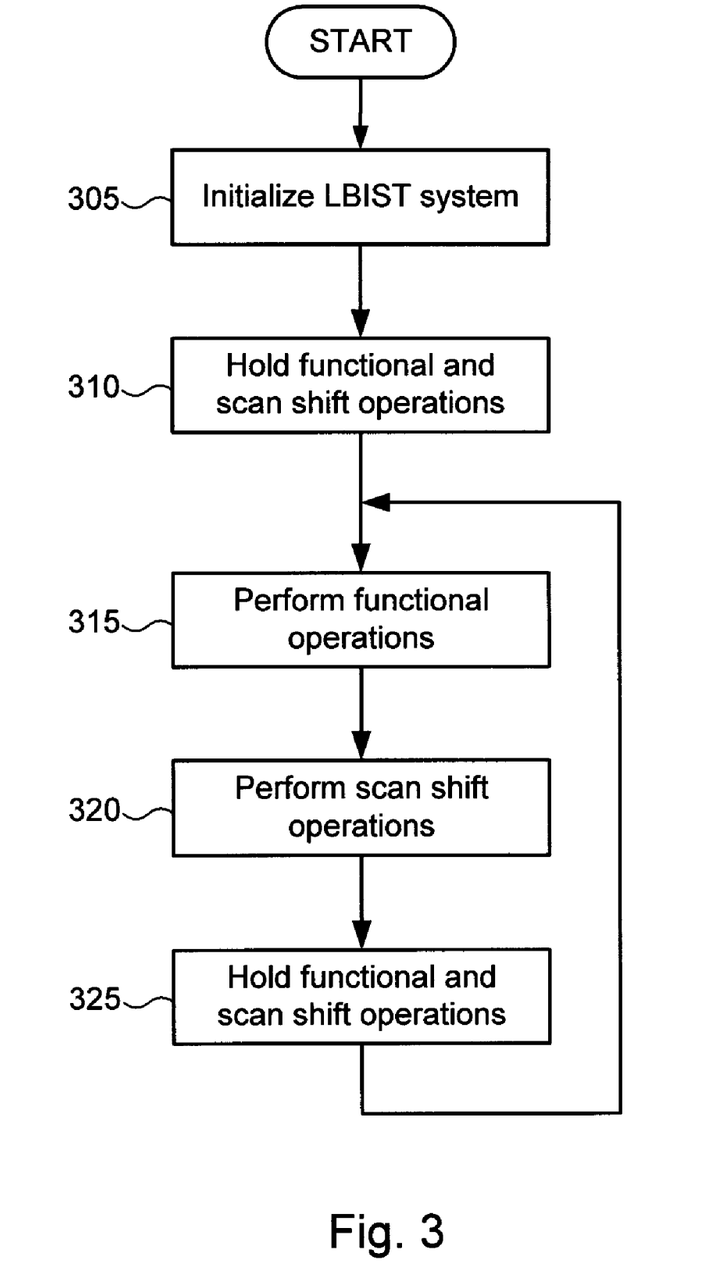
FIG. 3 is a flow diagram illustrating the initialization of an LBIST system and the performance of repeating test cycles in accordance with one embodiment.
Figure 4:
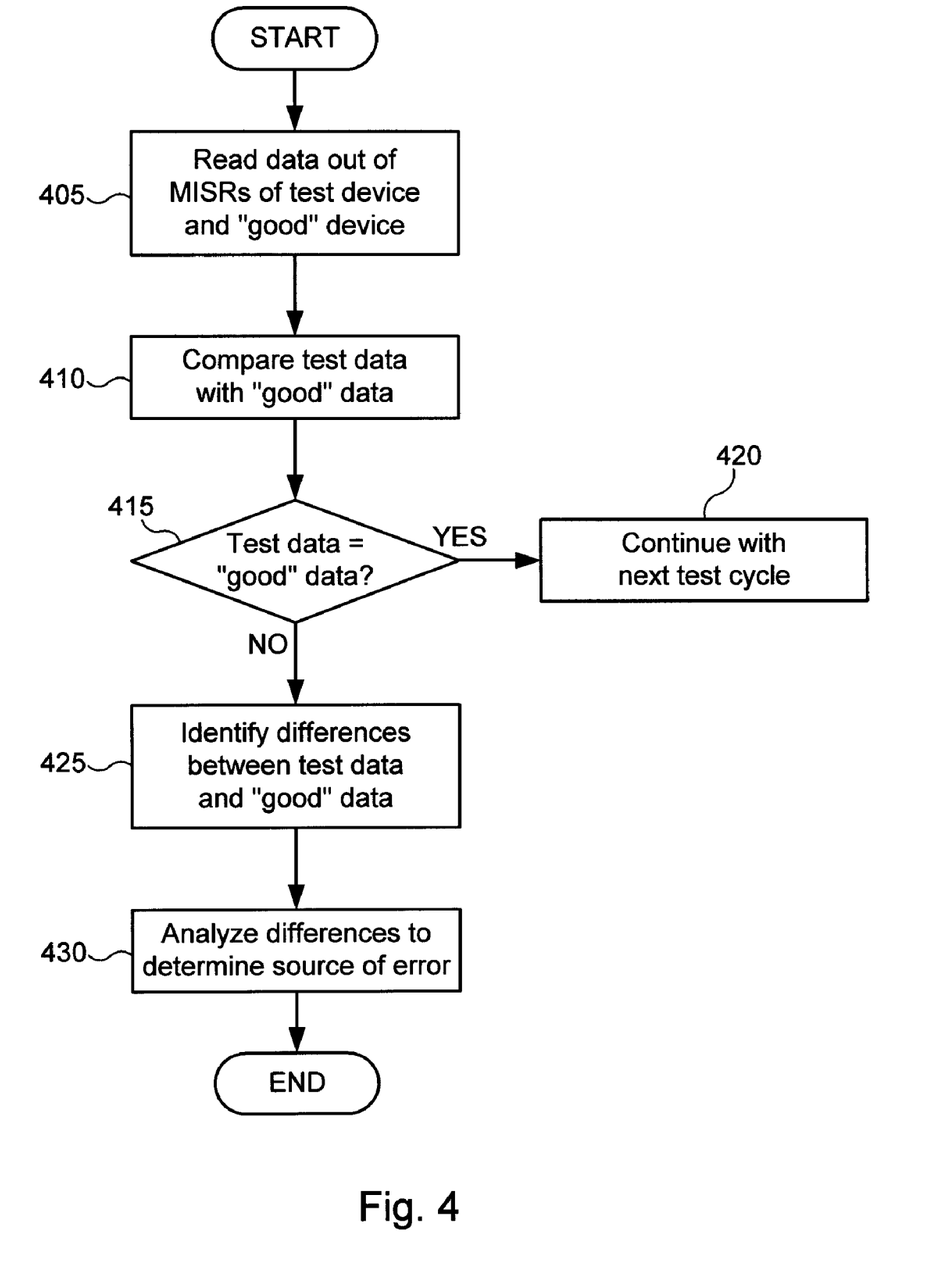
FIG. 4 is a flow diagram illustrating the examination of the data generated during each test cycle and the actions taken based upon this examination in accordance with one embodiment.

The operation of the LBIST system is summarized in FIGS. 3 and 4. FIG. 3 is a flow diagram illustrating the initialization of the system and the repeating test cycles that are performed. FIG. 4 is a flow diagram illustrating the examination of the data generated during each test cycle and the actions taken based upon this examination.

Referring to FIG. 3, operation of the system begins with the initialization of the LBIST components (block 305.) After the system is initialized, it enters a hold phase (block 310.) The system then executes a functional phase, including propagating data from the scan chains through the functional logic and capturing the resulting bit patterns in the scan chains (block 315.) Next, the system executes the scan shift phase, in which the captured bit patterns are scanned out of the scan chains while new pseudorandom bit patterns are scanned into the scan chains (block 320.) Then, the system enters a hold phase, in which the functional and scan shift operations of the system are suspended (block 325.) During the hold phase, the system determines whether execution of the LBIST testing will continue, or be suspended/halted. If it is determined that the testing will continue, the system executes another test cycle consisting of a functional phase (block 315,) a scan shift phase (block 320) and a hold phase (block 325.)

Referring to FIG. 4, operation of the system within the hold phase in one embodiment begins with the examination of the captured data that was scanned out of the scan chains. This examination begins with the reading of signature data out of the MISR (block 405.) This signature data is compared with the signature data generated in an identical device that is known to operate properly (block 410,) and it is determined whether the signature data of the device under test matches the signature data of the good device (block 415.) If the two signatures match, LBIST testing continues (block 420.) (This is equivalent to looping from block 325 to block 315 in FIG. 3.) If the two signatures do not match, the differences between the two signatures are identified (block 425,) and the differences are analyzed to determine the source of the error (block 430.)

It should be noted that while the embodiment depicted in FIG. 4 compares the data generated within the LBIST system of the device under test with corresponding data generated by a good device, alternative embodiments may determine in other ways whether or not the data corresponding to the device under test contains errors. For example, one alternative embodiment may determine whether the data contains errors by comparing it to data that was previously generated by a good device and was then stored in a memory. This data could be retrieved from the memory and compared to the data of the device under test in the same way that data of the good device is compared. Because of the very large amounts of data that would have to be stored, however, this is not believed to be as practical a solution as the comparison to good data that is generated in parallel with the data of the device under test. The "live" comparison also has the advantage of providing as little or as much data as is needed. For instance, the live comparison could continue to provide data for LBIST that continued for an indefinite period of time.

Figure 5:
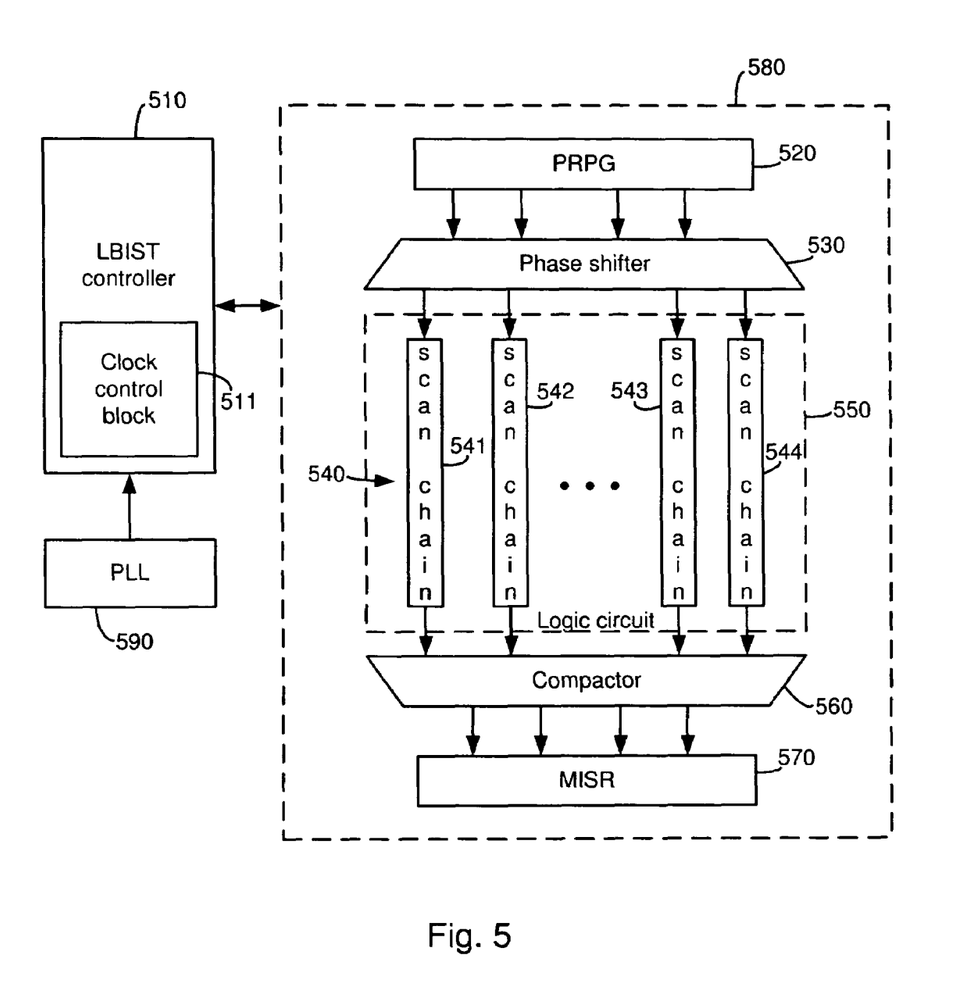
FIG. 5 is a functional block diagram illustrating an LBIST architecture that can be used in conjunction with the testing of large-scale logic circuits in accordance with one embodiment.

In one embodiment, the LBIST system is implemented as shown in the functional block diagram of FIG. 5. As depicted in FIG. 5, the STUMPS architecture comprises an LBIST controller 510, a PRPG 520, a phase shifter 530, a set of scan chains 540, a compacter 560 and a MISR 570. These LBIST components are integrated with a logic circuit 550, which the LBIST components are designed to test. (It should be noted that, while only four scan chains are depicted in FIG. 5, there may be many scan chains in the LBIST design.)

LBIST controller 510 includes control circuitry that controls the operation of the remainder of the LBIST components 580. (For purposes of clarity, LBIST controller 510 is depicted as being coupled to LBIST components 580 as a group, although the controller is typically coupled directly to each of the components.) One of the functions of LBIST controller 510 is to provide a seed value to PRPG 520. Based upon this seed value, PRPG 520 generates a pseudorandom sequence of bits that are processed by phase shifter 530 and loaded into scan chains 540.

PRPG 520 can be implemented as a linear feedback shift register (LFSR). The purpose of the pseudorandom sequence of bits generated by PRPG 520 is to provide a set of input bits to be propagated through the functional logic components of logic circuit 550. The pseudorandom sequence is therefore provided to each of the scan chains 540. It should be noted, however, that the pseudorandom bit sequence is loaded into scan chains 540 only after being processed by phase shifter 530.

The purpose of phase shifter 530 is to make the character of the bit sequence is loaded into scan chains 540 more random. When a LFSR is used to generate the pseudorandom bit pattern to be shifted into the scan chains, the sequence in each successive column may be identical to the sequence in the preceding column, except that the sequence is shifted down by one bit. Thus, there is a clearly identifiable pattern within the "random" sequences of bits. Phase shifter 530 shifts the phase of the pseudorandom sequence of bits so that no such pattern is identifiable within the succeeding bit sequences. Essentially, phase shifter 530 operates by shifting the phase of each succeeding column with respect to the preceding column. In other words, rather than being offset by a single bit in each succeeding column, the bit patterns in succeeding columns are shifted by different amounts. While not essential to the test architecture, phase shifter 530 therefore improves the operation of the test circuitry.

The pseudorandom bit patterns that are generated by PRPG 520 and phase shifter 530 are loaded into scan chains 540. Each of scan chains 540 comprises a series of scan latches that are configured to alternately shift data (the pseudorandom bit patterns or functional logic output) through the scan chains or to hold data that has been propagated through the functional logic. As indicated above, a separate sequence is loaded into each of scan chains 540. Each of scan chains 540 is positioned before or after (interposed with) respective portions of logic circuit 550. Thus, for each portion of logic circuit 550, there is a scan chain which precedes this portion and provides inputs to the corresponding logic, as well as a scan chain which follows this portion and receives the output of the corresponding logic. For example, one portion of logic circuit 550 may receive input bits from scan chain 541 and provide output bits to scan chain 542. Another portion of logic circuit 550 may receive input bits from scan chain 543 and provide output bits to scan chain 544. Some of scan chains 540 may serve both to provide input bits to a succeeding portion of logic circuit 550 and to receive output bits from a preceding portion of logic circuit 550.

After the pseudorandom bit patterns have been allowed to propagate through the functional components of logic circuit 550 and the results have been captured in scan chains 540, the contents of scan chains 540 are scanned out of the scan chains (i.e., they are unloaded from the scan chains) to compactor 560 and MISR 570. The purpose of compactor 560 is simply to reduce the number of bits that have to be handled by MISR 570. Compactor 560 may be implemented in a number of ways. Typically, compactor 560 will employ a series of XOR gates, where the output of each XOR gate is based upon inputs received from a pair of scan chains. The number of bits that are then passed to MISR 570 can therefore be reduced by a factor of 2. In alternative environments, more complex circuitry may allow the number of bits to be reduced by an even greater factor.

When the bits from scan chains 540 have been compacted by compactor 560, they are provided to MISR 570. MISR 570 provides a means to observe the resulting data bits and to compare this information to the expected output of the test system. Typically, MISR 570 enables the observation of a cumulative value that is based upon the output of the scan chains at each cycle. For example, in one embodiment, MISR 570 performs a modulo operation on the output of compactor 560. That is, MISR 570 divides the current value stored in MISR 570 by the output of compactor 560, and retains the remainder from this computation. This computation is performed, and the value stored in MISR 570 is updated, after each functional cycle.

The data stored in MISR 570 can be read out of the device, for instance, via a JTAG port of the device into which the LBIST components are incorporated. ("JTAG" stands for Joint Test Action Group, which is the group that developed this particular type of boundary scan port.) This allows the value stored in MISR 570 to be compared to an expected value. If the stored value does not match the expected value, then one or more of the operations performed by the functional components of logic circuit 550 failed, thereby providing an incorrect data bit in the output scan chain, which then propagated through compactor 560 to MISR 570.

The operation of LBIST components 580 is controlled by LBIST controller 510, which generates the control signals necessary to execute the phases of operation depicted in FIG. 2 (i.e., the initialization, function, scan shift and hold phases.)

The generation of these control signals is performed in this embodiment by clock control block 511, based upon a clock signal generated by PLL 590.

Figure 6:
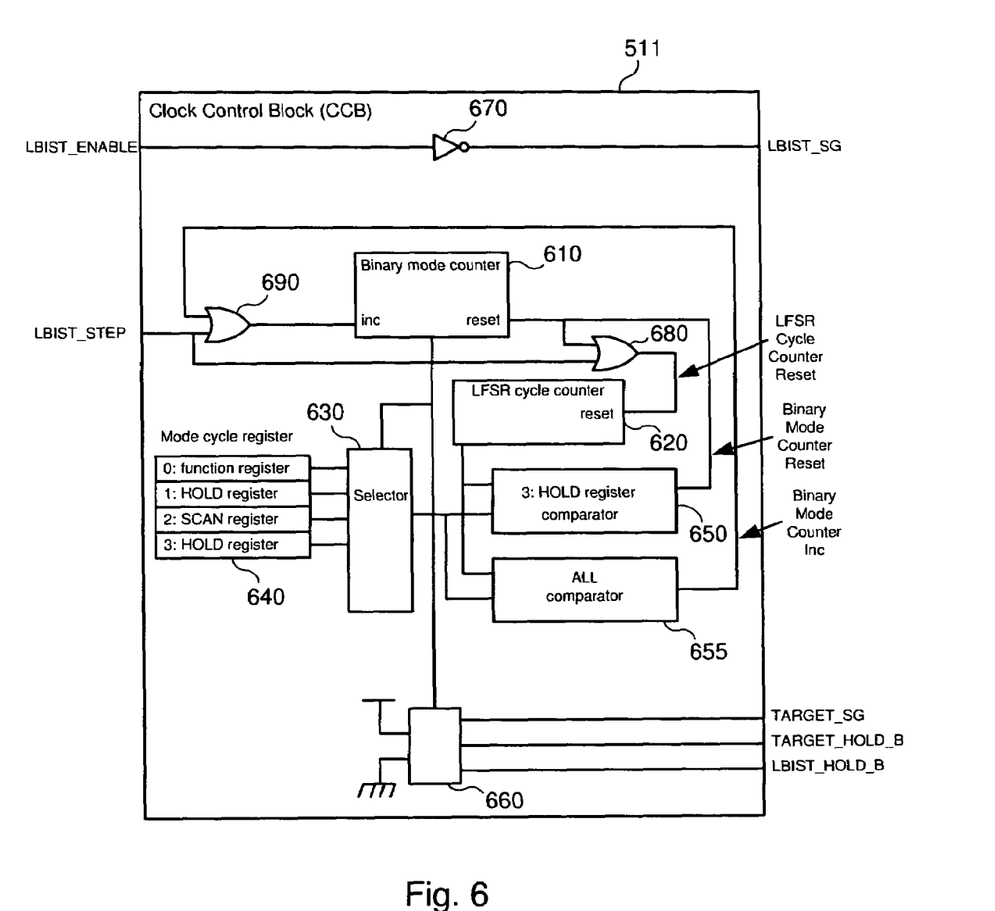
FIG. 6 is a functional block diagram illustrating the structure of a clock control block in accordance with one embodiment.

Referring to FIG. 6, a functional block diagram providing additional detail in regard to the structure of clock control block 511 in accordance with this embodiment is shown. As depicted in this figure, clock control block 511 includes a binary mode counter 610, a LFSR cycle counter 620, a register selector 630, a mode cycle register 640, a first comparator 650, a second comparator 655 and a decoder 660.

Clock control block 511 is configured in this embodiment to receive an LBIST_ENABLE signal and a LBIST_STEP signal, and to generate LBIST_SG (LBIST scan gate,) TARGET_SG (target scan gate,) TARGET_HOLD_B and LBIST_HOLD_B signals. LBIST_SG is generated simply by inverting LBIST_ENABLE (using inverter 670.) The generation of the remainder of the signals is somewhat more complex.

LBIST_STEP is received by OR gate 690, along with a Binary Mode Counter Inc(rement) signal. If either of these signals goes high, the output of OR gate 690 goes high. The output of OR gate 690 is provided to binary mode counter 610, and is used to increment this counter. In this embodiment, binary mode counter 610 increments through the values 0-3, each of which corresponds to one of the modes in which the LBIST system operates. Modes 0 and 1 correspond to the functional phase of the LBIST operation, while mode 2 corresponds to the scan shift phase, and mode 3 corresponds to the hold phase. The value of binary mode counter 610 is provided to decoder 660. Decoder 660 determines the values of signals TARGET_SG, TARGET_HOLD_B and LBIST_HOLD_B according to the mode identified by the value received from binary mode counter 610. Each time a particular value is received by decoder 660, the corresponding signal values are generated. The correspondence of the signal values and nodes are set forth below in Table 1.

TABLE 1

| Mode | TARGET_SG | TARGET_HOLD_B | LBIST_HOLD_B |
|---|---|---|---|
| 0 | 1 | 1 | 0 |
| 1 | 0 | 1 | 0 |
| 2 | 1 | 1 | 1 |
| 3 | 0 | 0 | 0 |

Register selector 630 also operates based upon the value of binary mode counter 610. Register selector 630, however, uses this value to select one of the registers of mode cycle register 640. The selected one of these registers holds a value that indicates the number of cycles in the corresponding mode. This value is provided by register selector 630 to comparator 650.

Comparator 650 compares the value provided by register selector 630 to a value provided by LFSR cycle counter 620. When the value provided by LFSR cycle counter 620 matches the value provided by register selector 630, comparator 650 asserts a signal (the Binary Mode Counter Reset signal) that resets binary mode counter 610 and LFSR cycle counter 620. Comparator 650 is only operable in mode 3, however. In other words, the output of comparator 650 will only be asserted when the value provided by LFSR cycle counter 620 matches the value provided by register selector 630 and the mode value is 3 (corresponding to a hold phase.) LFSR cycle counter 620 is also reset when the LBIST_STEP signal is asserted, as both the signal and the signal asserted by comparator 650 are input to OR gate 680, and the output of this gate is provided as a reset signal to LFSR cycle counter 620.

Comparator 655 also compares the value provided by register selector 630 to the value provided by LFSR cycle counter 620. The difference between Comparator 650 and comparator 655 is that comparator 655 is operable in all four modes. Thus, whenever the value provided by LFSR cycle counter 620 matches the value provided by register selector 630, comparator 655 asserts the Binary Mode Counter Inc(rement) signal that is input to OR gate 690.

Figure 7:
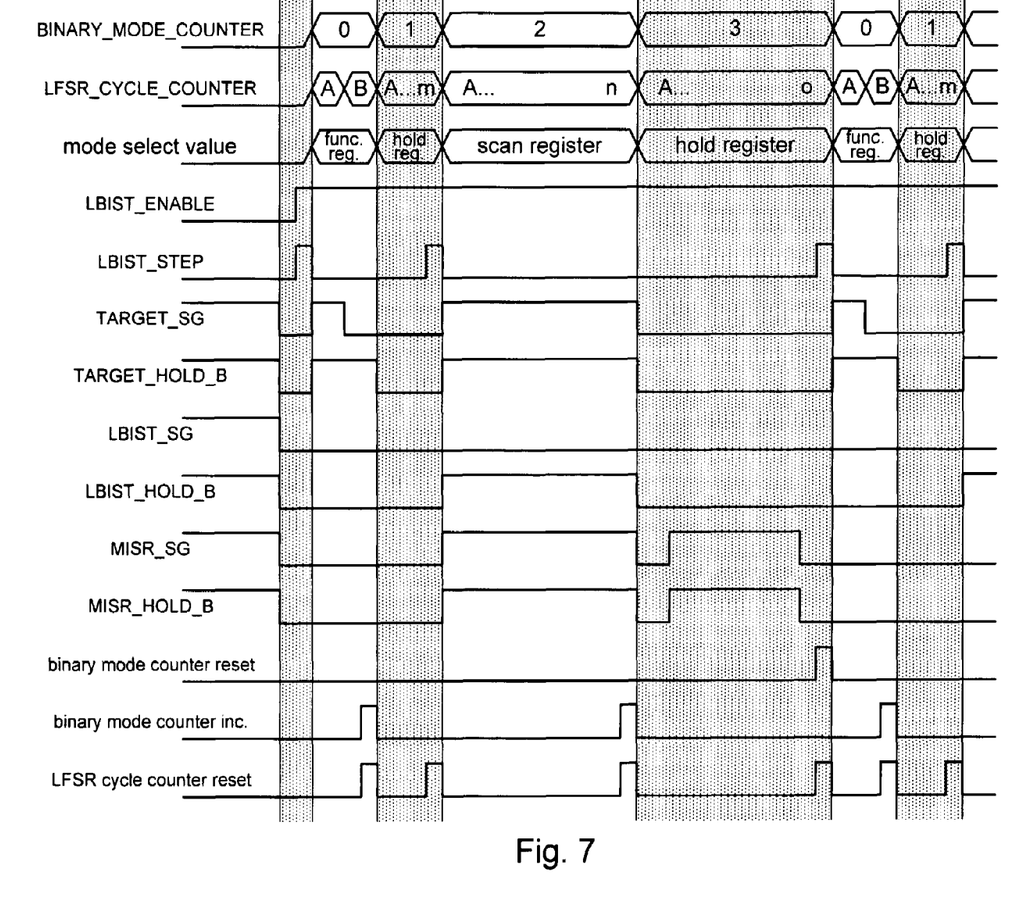
FIG. 7 is a diagram illustrating the timing of control signals generated by the clock control block in accordance with the embodiment of FIG. 6.

Clock control block 511 therefore generates the control signals as illustrated in FIG. 7. As shown in the figure, following an initialization phase and subsequent hold phase, the first test cycle begins when the LBIST_ENABLE signal is asserted and a pulse of the LBIST_STEP signal is received. (Each subsequent test cycle begins when the LBIST_ENABLE signal is asserted and a pulse of the Binary Mode Counter Reset signal is received.) The test cycle begins with a functional phase (mode 0.) In this embodiment, the functional phase lasts for two LFSR cycles. The functional phase is followed by a hold phase (mode 1.) This hold phase is terminated by a pulse of the LBIST_STEP signal.

This hold phase is followed by a scan shift phase (mode 2.) The scan shift phase lasts for n cycles, where n is the number of cycles required to replace the current bit pattern in each scan chain with a new bit pattern (hence to read all of the current bit pattern out of the scan chains.) Following the scan shift phase, a hold phase corresponding to mode 3 is initiated. The hold phase is maintained until another pulse of the LBIST_STEP signal is received, starting the functional phase of a new test cycle. This hold phase allows the data scanned out of the scan chains and stored in the MISR to be examined and/or compared to data scanned out of a "good" device's scan chains. The MISR is read when the MISR_SG and MISR_HOLD_B signals are asserted during the hold phase.

While the foregoing description presents several specific exemplary embodiments, there may be many variations of the described features and components in alternative embodiments. For example, the LBIST controller described above may be used to control the LBIST circuitry in both a device under test and a good device, or a separate LBIST controller may be used in conjunction with each of the devices. If separate LBIST controllers are used, it may be necessary in some embodiments to synchronize the test cycles so that the data generated in each test cycle can be properly compared. In another possible variation, while the foregoing embodiments involve suspending the functional and scan shift operations after each test cycle, an alternative embodiment may allow several test cycles to be performed between successive suspensions and corresponding comparisons of data. Many other variations will also be apparent to persons of skill in the art of the invention upon reading the present disclosure.

Those of skill in the art will understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. The information and signals may be communicated between components of the disclosed systems using any suitable transport media, including wires, metallic traces, vias, optical fibers, and the like.

Those of skill will further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Those of skill in the art may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with application specific integrated circuits (ASICs), field programmable gate arrays (FPGAs), general purpose processors, digital signal processors (DSPs) or other logic devices, discrete gates or transistor logic, discrete hardware components, or any combination thereof designed to perform the functions described herein. A general purpose processor may be any conventional processor, controller, microcontroller, state machine or the like. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in software (program instructions) executed by a processor, or in a combination of the two. Software may reside in RAM memory, flash memory, ROM memory, EPROM memory, EEPROM memory, registers, hard disk, a removable disk, a CD-ROM, or any other form of storage medium known in the art. Such a storage medium containing program instructions that embody one of the present methods is itself an alternative embodiment of the invention. One exemplary storage medium may be coupled to a processor, such that the processor can read information from, and write information to, the storage medium. In the alternative, the storage medium may be integral to the processor. The processor and the storage medium may reside, for example, in an ASIC. The ASIC may reside in a user terminal. The processor and the storage medium may alternatively reside as discrete components in a user terminal or other device.

The benefits and advantages which may be provided by the present invention have been described above with regard to specific embodiments. These benefits and advantages, and any elements or limitations that may cause them to occur or to become more pronounced are not to be construed as critical, required, or essential features of any or all of the claims. As used herein, the terms "comprises," "comprising," or any other variations thereof, are intended to be interpreted as non-exclusively including the elements or limitations which follow those terms. Accordingly, a system, method, or other embodiment that comprises a set of elements is not limited to only those elements, and may include other elements not expressly listed or inherent to the claimed embodiment.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein and recited within the following claims.

What is claimed is:

1. A method for performing a series of test cycles using pseudorandom patterns of bits in a logic built-in self test (LBIST) system, wherein the LBIST system includes a plurality of scan chains and a pseudorandom pattern generator (PRPG), wherein the plurality of scan chains extend between portions of functional logic of a device under test and are connected to each other through the portions of functional logic, each of the scan chains including a plurality of scan latches disposed correspondingly to levels of functional logic, and wherein the PRPG is coupled to the plurality of scan chains and configured to generate pseudorandom patterns of bits to be scanned into the scan chains, the method comprising, in each of the test cycles:

executing a functional phase in which functional operations are performed, including propagating data through the portions of functional logic of the device under test;

executing a first hold phase following the functional phase, wherein in the first hold phase functional operations are suspended and data propagated through the portions of functional logic of the device under test is held;

executing a scan shift phase in which scan shift operations are performed, including scanning data into and out of the scan latches through the plurality of the scan chains; and executing a second hold phase following the scan shift phase in which functional operations and scan shift operations are suspended, data scanned out of the plurality of scanned chains is analyzed, and a determination is made, based on the analyzed data scanned out of the plurality of scanned chains, whether to resume functional operations and scan shift operations for a subsequent test cycle, wherein, when the determination is to resume functional operations and scan shift operations for the subsequent test cycle, functional operations and scan shift operations for the subsequent test cycle are resumed without re-initializing the LBIST system.

2. The method of claim 1, wherein making the determination whether to resume functional operations and scan shift operations for a subsequent test cycle comprises:

determining whether the analyzed data contains errors;

determining to resume functional operations and scan shift operations for the subsequent test cycle when the analyzed data contains no errors; and determining not to resume functional operations and scan shift operations for the subsequent test cycle when the analyzed data contains errors.

3. The method of claim 1, wherein the data scanned out of the plurality of scan chains is analyzed by comparing the data scanned out of the plurality of scan chains to expected data.

4. The method of claim 1, wherein comparing the data scanned out of the plurality of scan chains to expected data comprises comparing the data scanned out of the plurality of scan chains to data scanned out of a plurality of scan chains in a second device that is known to operate properly.

5. The method of claim 1, wherein the data scanned out of the plurality of scan chains comprises signature data stored in a multiple input signature register (MISR) of the LBIST system.

6. The method of claim 1, further comprising performing an initialization of the LBIST system prior to performing a first one of the one or more test cycles.

7. A logic built-in self test (LBIST) system comprising:

a plurality of scan chains extending between portions of functional logic of a device under test, and connected to each other through the portions of functional logic, each of the scan chains including a plurality of scan latches disposed correspondingly to levels of functional logic; and a pseudorandom pattern generator (PRPG) coupled to the plurality of scan chains and configured to generate pseudorandom patterns of bits to be scanned into the scan chains; and an LBIST controller configured to generate control signals to control the LBIST system to perform test cycles respectively using the pseudorandom patterns of bits, wherein the LBIST controller is configured to cause the LBIST system to execute, in each of the test cycles:

a functional phase in which functional operations are performed, including propagating data through the portions of functional logic of the device under test, a first hold phase following the functional phase, wherein in the first hold phase functional operations are suspended and data propagated through the portions of functional logic of the device under test is held, a scan shift phase in which scan shift operations are performed, including scanning data into and out of the scan latches through the plurality of the scan chains, and a second hold phase following the scan shift phase in which functional operations and scan shift operations are suspended, including analyzing data scanned out of the plurality of scanned chains, and making a determination, based on the analyzing of the data scanned out of the plurality of scanned chains, whether to resume functional operations and scan shift operations for a subsequent test cycle, wherein, when the determination is to resume functional operations and scan shift operations for the subsequent test cycle, functional operations and scan shift operations for the subsequent test cycle are resumed, without re-initializing the LBIST system.

8. The system of claim 7, further comprising a multiple input signature register (MISR) coupled to the scan chains and configured to store signature data corresponding to bit patterns output from the scan chains.

9. The system of claim 8, further comprising:

a phase shifter coupled between the PRPG and the scan chains and configured to shift relative phases of bit patterns input to successive ones of the scan chains; and a compactor coupled between the scan chains and the MISR and configured to compact the bit patterns output from the scan chains and provide the compacted bit patterns to the MISR.

10. The system of claim 7, wherein the LBIST controller is configured to resume functional operations and scan shift operations for a subsequent test cycle when the bit patterns output from the scan chains contain no errors and to not resume functional operations and scan shift operations for the subsequent test cycle when the bit patterns output from the scan chains contain errors.

11. A system comprising:

a first device having LBIST circuitry incorporated therein, wherein the first device is a device under test;

a second device having LBIST circuitry incorporated therein, wherein the second device is known to operate without errors;

one or more LBIST controllers coupled to the first and second devices and configured to control each of the first and second devices to execute one or more LBIST test cycles, wherein each of the test cycles includes a functional phase in which functional operations are performed, including propagating data through functional logic of the device under test, a scan shift phase in which scan shift operations are performed, including scanning data into and out of a plurality of scan chains interposed between portions of the functional logic of the device under test, and a hold phase in which functional operations and scan shift operations are suspended, during the hold phase of each test cycle, compare data scanned out of the scan chains of the first device to data scanned out of the scan chains of the second device, and resume functional operations and scan shift operations for a subsequent test cycle without re-initializing the LBIST circuitry of the first and second devices when the data scanned out of the scan chains of the first device are the same as the data scanned out of the scan chains of the second device.

12. The system of claim 11, wherein the one or more LBIST controllers are configured to compare data scanned out of the scan chains of the first device to data scanned out of the scan chains of the second device by comparing a first signature stored in a multiple input signature register (MISR) of the first device with a second signature stored in a MISR of the second device.

13. The system of claim 11, wherein the one or more LBIST controllers are configured to perform an initialization of the LBIST circuitry of the first and second devices prior to performing the one or more test cycles.

* * * * *